(12) United States Patent
Kim

(10) Patent No.: US 12,283,325 B2
(45) Date of Patent: Apr. 22, 2025

(54) MEMORY DEVICE AND OPERATING METHOD OF THE MEMORY DEVICE FOR CONTROLLING PROGRAM OPERATION

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 214 days.

(21) Appl. No.: 18/070,199

(22) Filed: Nov. 28, 2022

(65) Prior Publication Data
US 2024/0013838 A1    Jan. 11, 2024

(30) Foreign Application Priority Data
Jul. 6, 2022   (KR) .................. 10-2022-0083292

(51) Int. Cl.
| | | |
|---|---|---|
| G11C 16/10 | (2006.01) | |
| G11C 16/08 | (2006.01) | |
| G11C 16/12 | (2006.01) | |
| G11C 16/34 | (2006.01) | |

(52) U.S. Cl.
CPC ............ G11C 16/102 (2013.01); G11C 16/08 (2013.01); G11C 16/12 (2013.01); G11C 16/3459 (2013.01)

(58) Field of Classification Search
None
See application file for complete search history.

(56) References Cited

U.S. PATENT DOCUMENTS

| | | | | |
|---|---|---|---|---|
| 2008/0101126 A1* | 5/2008 | Hemink | ............ | G11C 16/3454 |
| | | | | 365/185.19 |
| 2010/0061151 A1* | 3/2010 | Miwa | .................. | G11C 11/5628 |
| | | | | 365/185.17 |
| 2010/0097861 A1* | 4/2010 | Dutta | .................. | G11C 11/5628 |
| | | | | 365/185.17 |
| 2011/0222342 A1* | 9/2011 | Yoon | .................. | G11C 16/0483 |
| | | | | 365/185.18 |
| 2012/0206967 A1* | 8/2012 | Lutze | ................. | G11C 16/3404 |
| | | | | 365/185.17 |
| 2013/0010537 A1* | 1/2013 | Kawai | .................... | G11C 16/10 |
| | | | | 365/185.18 |

(Continued)

FOREIGN PATENT DOCUMENTS

| | | | |
|---|---|---|---|
| KR | 100766241 B1 | 10/2007 | |
| KR | 1020130042780 A | 4/2013 | |

*Primary Examiner* — J. H. Hur
(74) *Attorney, Agent, or Firm* — WILLIAM PARK & ASSOCIATES LTD.

(57) ABSTRACT

There are provided a memory device and an operating method of the memory device. The memory device includes: a memory block including a plurality of pages, each page from the plurality of pages including memory cells, the memory cells configured to be programmed to different program states according to a plurality of target voltages; and a peripheral circuit for performing a program operation of a selected page among the plurality of pages. The peripheral circuit is configured to: decrease at least one target voltage among the plurality of target voltages to a sub-target voltage in the program operation of the selected page; and program memory cells programmed according to the sub-target voltage in the selected page according to a final target voltage corresponding to the sub-target voltage, after a program operation of a page adjacent to the selected page is performed.

23 Claims, 14 Drawing Sheets

(56) References Cited

U.S. PATENT DOCUMENTS

| | | | | |
|---|---|---|---|---|
| 2013/0117500 A1* | 5/2013 | Joo | .................... | G11C 13/0007 |
| | | | | 711/E12.008 |
| 2013/0135929 A1* | 5/2013 | Lee | .................... | G11C 16/0483 |
| | | | | 365/185.03 |
| 2013/0235666 A1* | 9/2013 | Sakamoto | .............. | G11C 16/04 |
| | | | | 438/589 |
| 2014/0016415 A1* | 1/2014 | Kamei | ................ | G11C 11/5628 |
| | | | | 365/185.18 |
| 2014/0119115 A1* | 5/2014 | Jung | ...................... | G11C 16/16 |
| | | | | 365/185.03 |
| 2015/0039809 A1* | 2/2015 | Kim | ................... | G11C 16/0483 |
| | | | | 711/103 |
| 2020/0051620 A1* | 2/2020 | Li | .......................... | G11C 16/10 |

* cited by examiner

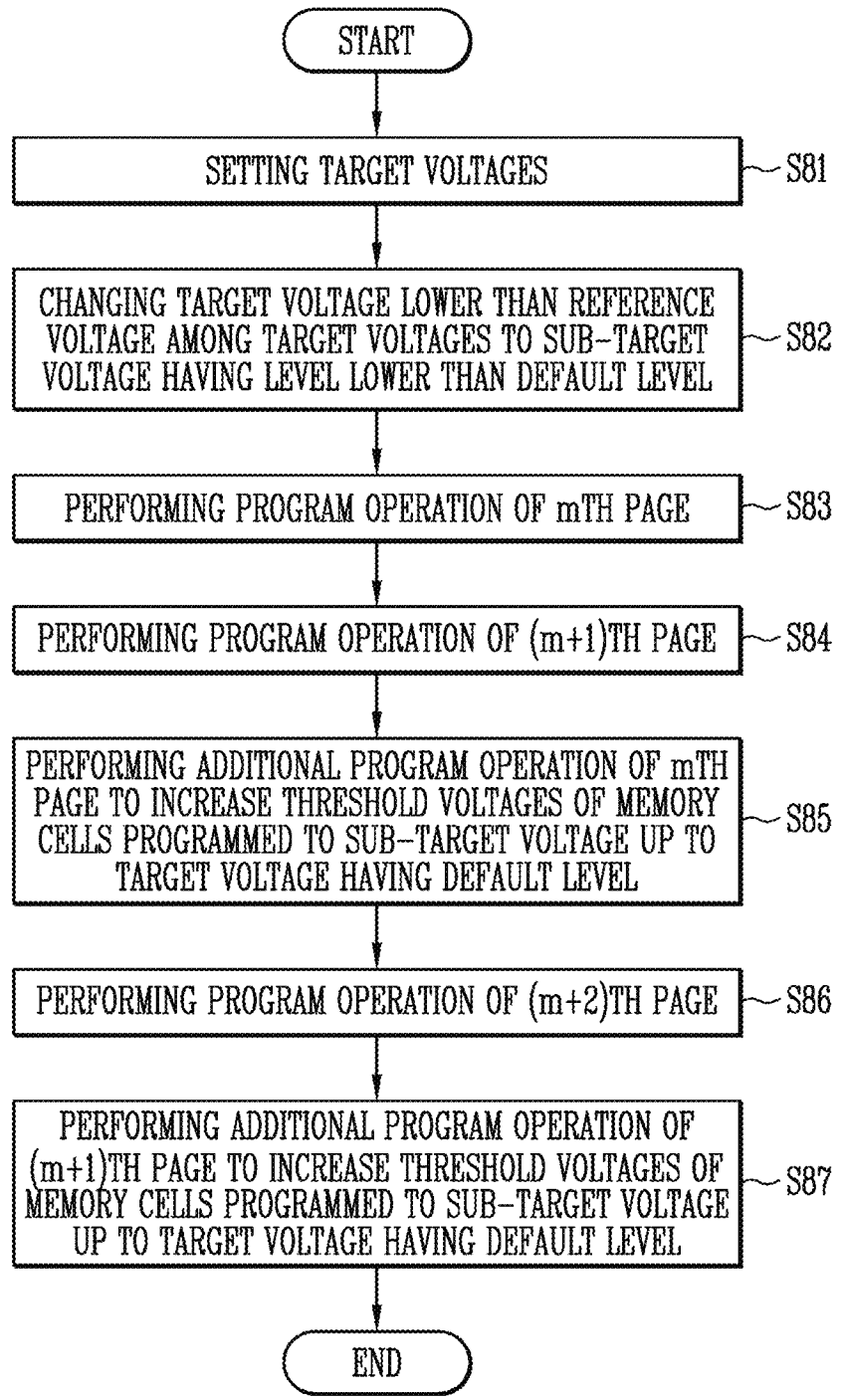

THRESHOLD VOLTAGE DISTRIBUTION OF MEMORY CELLS
INCLUDED IN PGm IN PROGRAM OPERATION OF PGm

THRESHOLD VOLTAGE DISTRIBUTION OF MEMORY CELLS
INCLUDED IN PGm IN PROGRAM OPERATION OF PGm+1

12 # MEMORY DEVICE AND OPERATING METHOD OF THE MEMORY DEVICE FOR CONTROLLING PROGRAM OPERATION

CROSS-REFERENCE TO RELATED APPLICATION

The present application claims priority under 35 U.S.C. § 119(a) to Korean patent application number 10-2022-0083292, filed on Jul. 6, 2022, in the Korean Intellectual Property Office, the entire disclosure of which is incorporated herein by reference.

BACKGROUND

1. Technical Field

The present disclosure generally relates to a memory device and an operating method of the memory device, and more particularly, to a memory device configured to program memory cells and an operating method of the memory device.

2. Related Art

A memory system may include a storage configured to store data and a controller configured to control the storage.

The storage may include one or more memory devices, and the controller may output a command for controlling the memory devices. For example, the controller may generate a program, read, or erase command in response to a request output from a host, and transmit the command to the memory device. The memory device may perform a program, read, or erase operation in response to the command. The program operation will be described as an example. The memory device may program memory cells included in a selected memory block in units of pages.

As the degree of integration of memory devices increases, a distance between memory cells included in a memory block also decreases. When the distance between the memory cells is narrowed, threshold voltages of the memory cells may be changed due to interference between the memory cells in a program operation.

SUMMARY

In accordance with an embodiment, there may be provided a memory device including: a memory block including a plurality of pages, each page from the plurality of pages including memory cells, the memory cells configured to be programmed to different program states according to a plurality of target voltages; and a peripheral circuit configured to perform a program operation of a selected page among the plurality of pages, wherein the peripheral circuit is configured to: decrease at least one target voltage among the plurality of target voltages to a sub-target voltage in the program operation of the selected page; and program memory cells programmed according to the sub-target voltage in the selected page according to a final target voltage corresponding to the sub-target voltage, after a program operation of a page adjacent to the selected page is performed.

In accordance with an embodiment, there may be provided a method of operating a memory device, the method including: setting target voltages corresponding to program states of memory cells; decreasing, to a sub-target voltage, a target voltage lower than a reference voltage among the target voltages; performing a program operation of a selected page according to the other target voltages except a target voltage corresponding to the sub-target voltage among the target voltages and the sub-target voltage; performing a program operation of a page adjacent to the selected page, when the program operation of the selected page is ended; and performing an additional program operation of memory cells programmed according to the sub-target voltage in the selected page, when the program operation of the adjacent page is ended.

In accordance with an embodiment, there may be provided a method of operating a memory device, the method including: setting first to Kth target voltages; decreasing the first target voltage to a first sub-target voltage; programming memory cells to be programmed according to the first target voltage among memory cells included in an mth page among pages included in a memory block according to the first sub-target voltage, and programming the other memory cells according to the second to Kth target voltages; programming memory cells included in an (m+1)th page adjacent to the mth page among the pages included in the memory block in the same manner as a program operation performed on the mth page, wherein 'm' is an integer greater than zero; and additionally programming memory cells programmed according to the first sub-target voltage among the memory cells included in the mth page according to the first target voltage, when a program operation of the (m+1)th page is ended.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a diagram illustrating an example of a program operation in accordance with an embodiment of the present disclosure.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Hereinafter, it will be understood that, although the terms "first," "second," etc. may be used herein to describe various elements, these elements should not be limited by these terms. These terms are only used to distinguish one element from another element.

Various embodiments provide a memory device capable of improving the reliability of a program operation and an operating method of the memory device.

Figure 1:
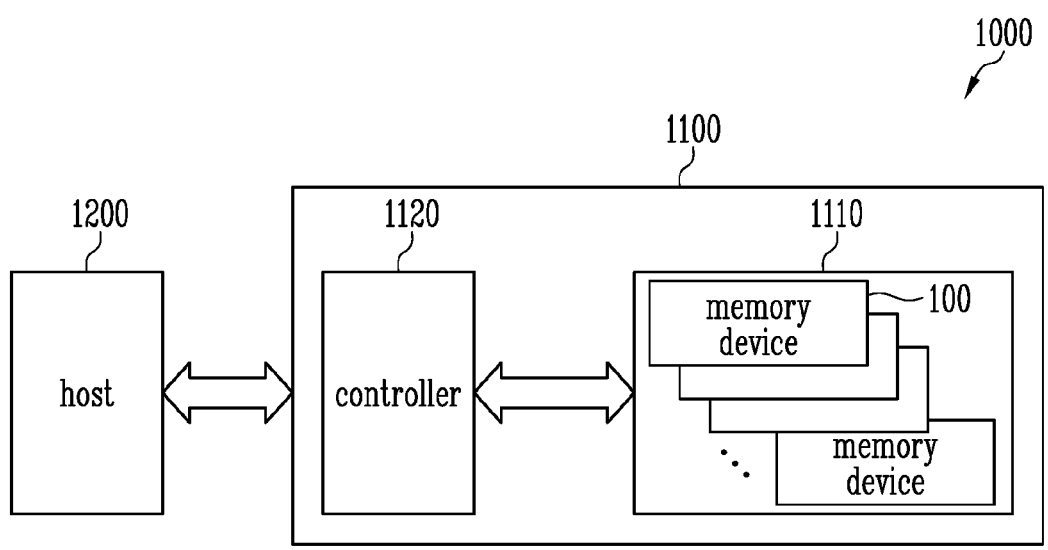
FIG. 1 is a diagram illustrating an example of a memory system.

FIG. 1 is a diagram illustrating a memory system.

Referring to FIG. 1, the memory system 1000 may include a memory module 1100 and a host 1200.

The memory module 1100 may include a memory group 1110 and a controller 1120. The memory module 1100 may be configured to store or output data under the control of the host 1200, such as a mobile phone, a smart phone, an MP3 player, a laptop computer, a desktop computer, a game console, a TV, a tablet PC or an in-vehicle infotainment.

The memory module 1100 may be manufactured as any one of various types of memory modules according to a host interface that is a communication scheme with the host 1200. For example, the memory module 1100 may be configured with any one of a variety of types of memory modules, such as a Solid State Drive (SSD), a multimedia card in the form of an MMC, an eMMC, an RS-MMC and a micro-MMC, a secure digital card in the form of an SD, a mini-SD and a micro-SD, a Universal Serial Bus (USB) memory module, a Universal Flash Storage (UFS) device, a personal computer memory card international association (PCMCIA) card type memory module, a peripheral component interconnection (PCI) card type memory module, a PCI express (PCI-E) card type memory module, a Compact Flash (CF) card, a Smart Media Card (SMC), and a memory stick.

The memory module 1100 may be manufactured as any one of various kinds of package types. For example, the memory module 1100 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory module 1100 may include at least one memory device 100. The memory device 100 may store data. The memory device 100 may be operated under the control of the controller 1120. The memory device 100 may include a memory cell array including memory blocks in which data can be stored. The memory block may be a unit for erasing data.

Each of the memory blocks may include a plurality of memory cells. Each of the memory cells may be configured as a single level cell storing one-bit data, a multi-level cell storing two-bit data, a triple level cell storing three-bit data, or a quad level cell storing four-bit data. In addition, each of the memory cells may store five or more-bit data.

Each of the memory blocks may include a plurality of pages configured with memory cells. The page may be a group of memory cells connected to a word line. The memory device 100 may program or read memory cells included in a selected memory block in units of pages.

The memory device 100 may be configured as a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like.

The memory device 100 may be configured to receive a command and an address from the controller 1120, and access a memory block selected according to the address. That is, the memory device 100 may perform an operating indicated by the command in the memory block selected by the address. The memory device 100 may perform a program, read, or erase operation in response to the command. The command may be a program command, a read command, or an erase command. For example, the memory device 100 may program data in the memory block selected by the address in response to the program command. The memory device 100 may read and output data from the memory block selected by the address in response to the read command. The memory device 100 may erase data of the memory block selected by the address in response to the erase command. Also, the memory device 100 may suspend an operation being performed currently in response to a suspend command, and resume the suspended operation in response to a resume command.

The controller 1120 may control overall operations of the memory module 1100. For example, when power is applied to the memory module 1100, the controller 1120 may execute firmware (FW). When the memory device 100 is a flash memory device, the controller 1120 may execute firmware such as a Flash Translation Layer (FTL) for controlling communication between the host 1200 and the memory device 100. For example, the controller 1120 may receive data and a logical address from the host 1200, and receive a request for various operations. The controller 1120 may translate the logical address into a physical address representing positions of memory cells of the memory device 100, in which data is to be stored.

The controller 1120 may control the memory device 100 to perform a program operation, a read operation, an erase operation, or the like according to a request of the host 1200, or control the memory device 100 to suspend an operation being performed in the memory device 100. In a program operation, the controller 1120 may provide the memory device 100 with a program command, a physical block address, and data. In a read operation, the controller 1120 may provide the memory device 100 with a read command and a physical block address. In an erase operation, the controller 1120 may provide the memory device 100 with an erase command and a physical block address.

The controller 1120 may perform background operations for autonomously managing the memory device regardless of any request of the host 1200. For example, in a background operation, the controller 1120 may generate a command, an address, and data without any request of the host 1200, and transmit the command, the address, and the data to the memory device 100. For example, the controller 1120 may provide the memory device 100 with a command, an address, and data to perform background operations such as wear leveling, garbage collection, auto refresh, and read reclaim. The controller 1120 may control at least two memory devices 100.

The host 1200 may communicate with the memory module 1100, using at least one of various communication schemes, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Compute eXpress Link (CXL) a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
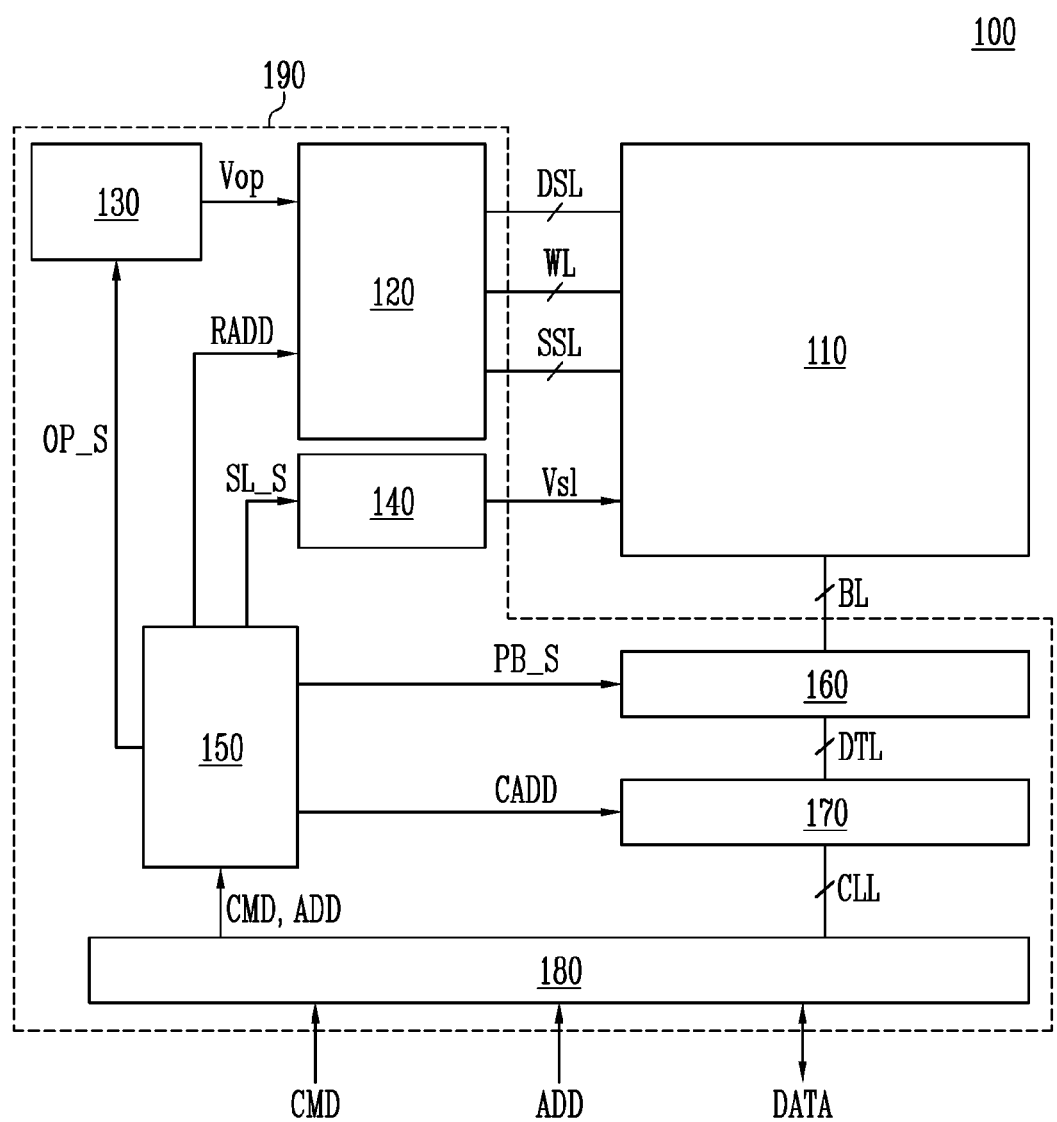
FIG. 2 is a diagram illustrating an example of a memory device.

FIG. 2 is a diagram illustrating a memory device.

Referring to FIG. 2, the memory device 100 may include a memory cell array 110 and a peripheral circuit 190.

The memory cell array 110 may include memory cells in which data is stored. In an embodiment, the memory cell array 110 may include a three-dimensional memory cell array. The memory cells may store one-bit data or multi-bit data of two or more bits according to a program manner. The memory cells may constitute memory cell strings. For example, each of the memory cell strings may be connected between bit lines BL and a source line.

The peripheral circuit 190 may be configured to perform a program operation for storing data in the memory cell array 110, a read operation for outputting data stored in the memory cell array 110, and an erase operation for erasing data stored in the memory cell array 110. The peripheral circuit 190 may include a row decoder 120, a voltage generating circuit 130, a source line driver 140, a control circuit 150, a page buffer group 160, a column decoder 170, and an input/output circuit 180.

The row decoder 120 may be connected to the memory cell array 110 through drain select lines DSL, word lines WL, and source select lines SSL. The row decoder 120 may transfer operating voltages Vop to the drain select lines DSL, the word lines WL, and the source select lines SSL in response to a row address RADD. When dummy lines are connected to the memory cell array 110, the row decoder 120 may transfer the operating voltages Vop to the dummy lines in response to the row address RADD.

The voltage generating circuit 130 may generate various operating voltages Vop used for a program operation, a read operation, or an erase operation in response to an operation signal OP_S. For example, the voltage generating circuit 130 may generate the operating voltages Vop having various levels in response to the operation signal OP_S, and output the operating voltages Vop in response to the operation signal OP_S. The operating voltages Vop may include a program voltage, a pass voltage, a turn-on voltage, a turn-off voltage, a ground voltage, a read voltage, and the like. The program voltage is a voltage applied to a selected word line in a program operation, and may be used to increase a threshold voltage of memory cells. The pass voltage is a voltage applied to unselected word lines in a program or read operation, and may be used to turn on unselected memory cells. The turn-on voltage is a voltage for turning on drain or source select transistors connected to drain or source select lines DSL or SSL, and may have a positive voltage. The turn-off voltage is a voltage for turning off drain or source select transistors, and may have a ground voltage or 0V. The read voltage is a voltage applied to a selected word line in a read operation, and may be set to have various levels according to logical page data stored in memory cells.

The source line driver 140 may transmit a source voltage Vsl supplied therefrom to the source line connected to the memory cell array 110 or float the source line in response to a source line control signal SL_S. The source voltage Vsl may be a ground voltage or 0V, a positive voltage higher than 0V, or a negative voltage lower than 0V. In an erase operation, the source line driver 140 may transmit an erase voltage to the source line. The erase voltage is a voltage for decreasing a threshold voltage of memory cells, and may be set as a positive voltage.

The control circuit 150 may output the operation signal OP_S, the row address RADD, the source line control signal SL_S, a page buffer control signal PB_S, and a column address CADD, in response to a command CMD and an address ADD. For example, when a program command is input to the control circuit 150, the control circuit 150 may control the peripheral circuit 190 to perform a program operation of a selected page among pages included in a selected memory block. When memory cells included in the selected page are programmed in a manner than stores two or more-bit data, the control circuit 150 may change a target voltage lower than a reference voltage among target voltages to a sub-target voltage by considering interference which may occur between adjacent pages, and output an operation signal OP_S for generating various voltages including the sub-target voltage.

When the operation signal OP_S is output from the control circuit 150, the voltage generating circuit 130 may set a level of a program voltage, a pass voltage, or a verify voltage in response to the operation signal OP_S, and output the set voltage according to a set time. For example, the voltage generating circuit 130 may transmit the program voltage to a selected global line connected to a selected word line in response to the operation signal OP_S, and transmit the pass voltage to unselected global lines connected to unselected word lines. When the selected word line is changed, the voltage generating circuit 130 may transmit the program voltage to a global line connected to the changed word line, and transmit the pass voltage to the other unselected global lines.

The control circuit 150 may output an operation signal OP_S for decreasing, to a sub-voltage, a target voltage lower than the reference voltage among target voltages of memory cells included in a selected page. A voltage difference between the target voltage and the sub-voltage may be set to a level higher than a change level of a threshold voltage due to interference occurring in a program operation of adjacent memory cells.

The page buffer group 160 may include a plurality of page buffers connected to the memory cell array 110 through the bit lines BL. The page buffers may store data DATA received through a plurality of bit lines BL in response to the page buffer control signal PB_S. In a program operation, the page buffers may apply a program allow voltage to selected bit lines and apply a program inhibit voltage to inhibited bit lines. The program allow voltage may be 0V or a negative voltage, and the program inhibit voltage may be a power voltage.

The column decoder 170 may transmit data DATA input from the input/output circuit 180 to the page buffer group 160 or transmit data DATA stored in the page buffer group 160 to the input/output circuit 180, in response to the column address CADD. The column decoder 170 may exchange data DATA with the input/output circuit 180 through column lines CLL. The column decoder 170 may exchange data DATA with the page buffer group 160 through data lines DTL.

The input/output circuit 180 may transfer, to the control circuit 150, a command CMD and an address ADD, which are transferred from an external device (e.g., a controller) of the memory device 100. The input/output circuit 180 may receive data transferred from the external device in a program operation, and output data DATA read from selected memory cells to the external device in a read operation.

Figure 3:
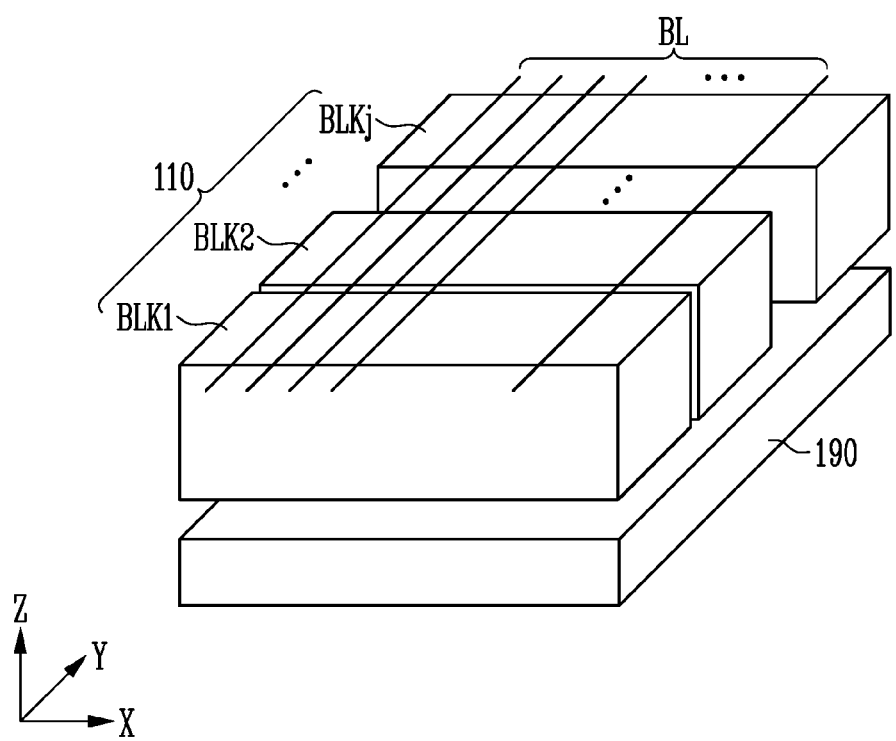
FIG. 3 is a diagram illustrating an example of an arrangement of a memory cell array and a peripheral circuit.

FIG. 3 is a diagram illustrating an arrangement of a memory cell array and a peripheral circuit.

Referring to FIG. 3, the memory device (100 shown in FIG. 2) may include a peripheral circuit 190 and a memory cell array 110. The peripheral circuit 190 may be disposed above a substrate, and the memory cell array 110 may disposed above the peripheral circuit 190. The memory cell array 110 may include first to jth memory blocks BLK1 to BLKj. A plurality of bit lines BL may be disposed above the first to jth memory blocks BLK1 to BLKj.

The plurality of bit lines BL may be arranged to be spaced apart from each other in an X direction, and extend along a Y direction. The first to jth memory blocks BLK1 to BLKj may be arranged to be spaced apart from each other in the Y direction. The first to jth memory blocks BLK1 to BLKj may be configured identically to one another, and therefore, the first memory block BLK1 will be described below as an example.

Figure 4:
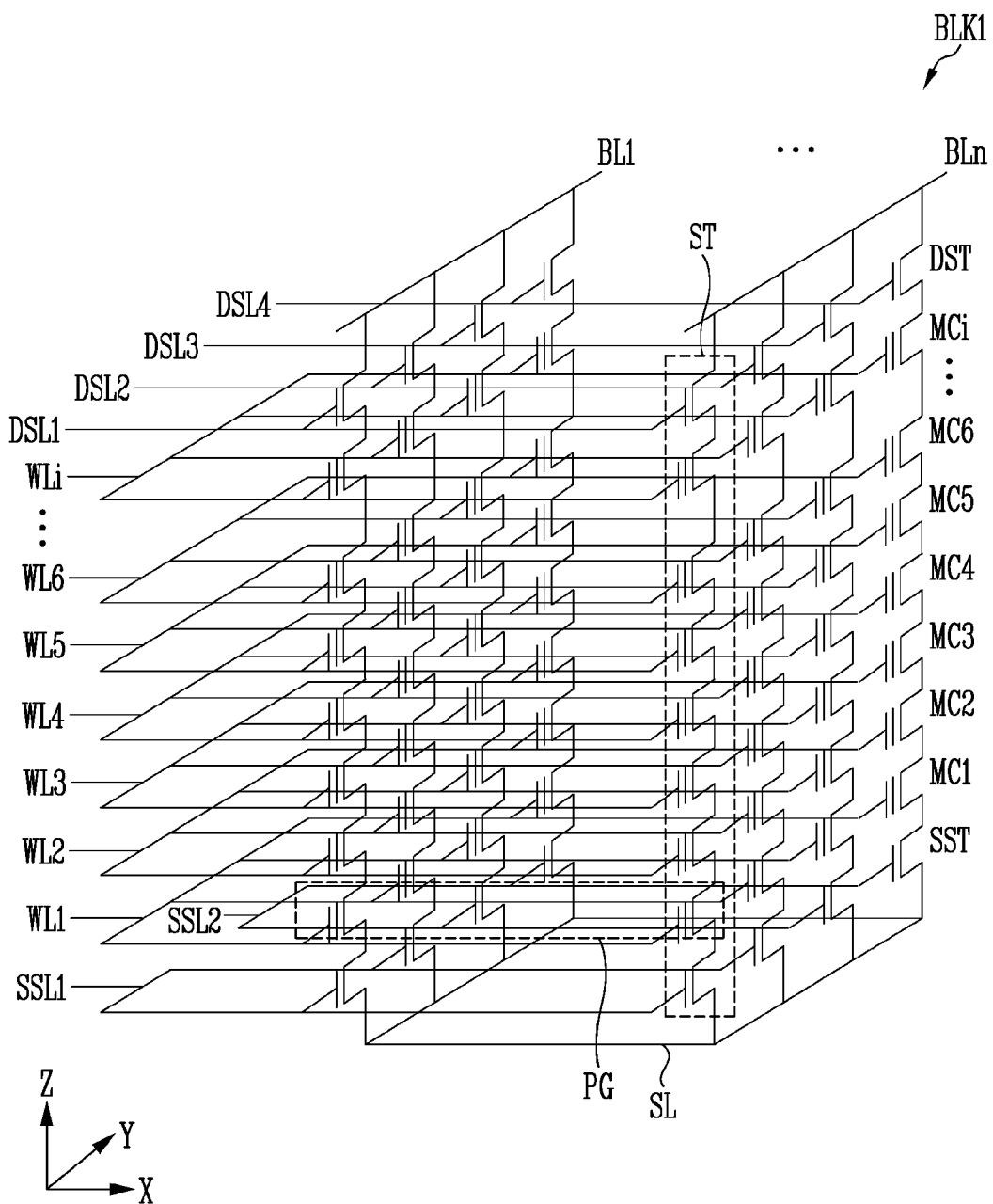
FIG. 4 is a circuit diagram illustrating an example of a connection configuration of a memory block.

FIG. 4 is a circuit diagram illustrating a connection configuration of a memory block.

Referring to FIG. 4, the first memory block BLK1 includes strings ST connected between first to nth bit lines BL1 to BLn and a source line SL. The first to nth bit lines BL1 to BLn extend along the Y direction, and are arranged to be spaced apart from each other along the X direction. Therefore, the strings ST may also be arranged to be spaced apart from each other along the X and Y directions. For example, strings ST may be arranged between the first bit line BL1 and the source line SL, and strings ST may be arranged between the second bit line BL2 and the source line SL. In this manner, strings ST may be arranged between the nth bit line BLn and the source line SL. The strings ST may extend along a Z direction.

Any one string ST among the strings ST connected to the nth bit line BLn will be described as an example. The string ST may include a source select transistor SST, first to ith memory cells MC1 to MCi, and a drain select transistor DST. The first memory block BLK1 shown in FIG. 4 represents a diagram schematically illustrating a structure of a memory block, and therefore, numbers of source select transistors SST, first to ith memory cells MC1 to MCi, and drain select transistors DST, which are included in the strings ST, may be changed according to a memory device.

Gates of source select transistors SST included in different strings may be connected to a first or second source select line SSL1 or SSL2, gates of first to ith memory cells MC1 to MCi included in different strings may be connected to first to ith word lines WL1 to WLi, and gates of drain select transistors DST included in different strings may be connected to any one of first to fourth drain select lines DSL1 to DSL4.

The lines connected to the first memory block BLK1 will be described below. Source select transistors SST arranged along the X direction may be connected to the same source select line, and source select transistors SST arranged along the Y direction may be connected to source select lines isolated from each other. For example, some of source select transistors SST arranged in the Y direction may be connected to a first source select line SSL1, and the others may be connected to the second source select line SSL2. The second source select line SSL2 is a line isolated from the first source select line SSL1. Therefore, a voltage applied to the first source select line SSL1 may be equal to or different from a voltage applied to the second source select line SSL2.

Memory cells formed in the same layer among the first to ith memory cells MC1 to MCi may be connected to the same word line. For example, first memory cells MC1 included in different strings ST may be commonly connected to the first word line WL1, and ith memory cells MCi included in different strings ST may be commonly connected to the ith word line WLi. A group of memory cells which are included in different strings ST and are connected to the same word line becomes a page PG. Program and read operations may be performed in units of pages PG.

Drain select transistors DST arranged in the Y direction may be connected to the first to fourth drain select lines DSL1 to DSL4 isolated from each other. Specifically, drain select transistors DST arranged along the X direction may be connected to the same drain select line, and drain select transistors DST arranged along the Y direction may be connected to the first to fourth drain select lines DSL1 to DSL4 isolated from each other. Since the first to fourth drain select lines DSL1 to DSL4 are isolated from each other, different voltages may be applied to the first to fourth drain select lines DSL1 to DSL4.

Figure 5:
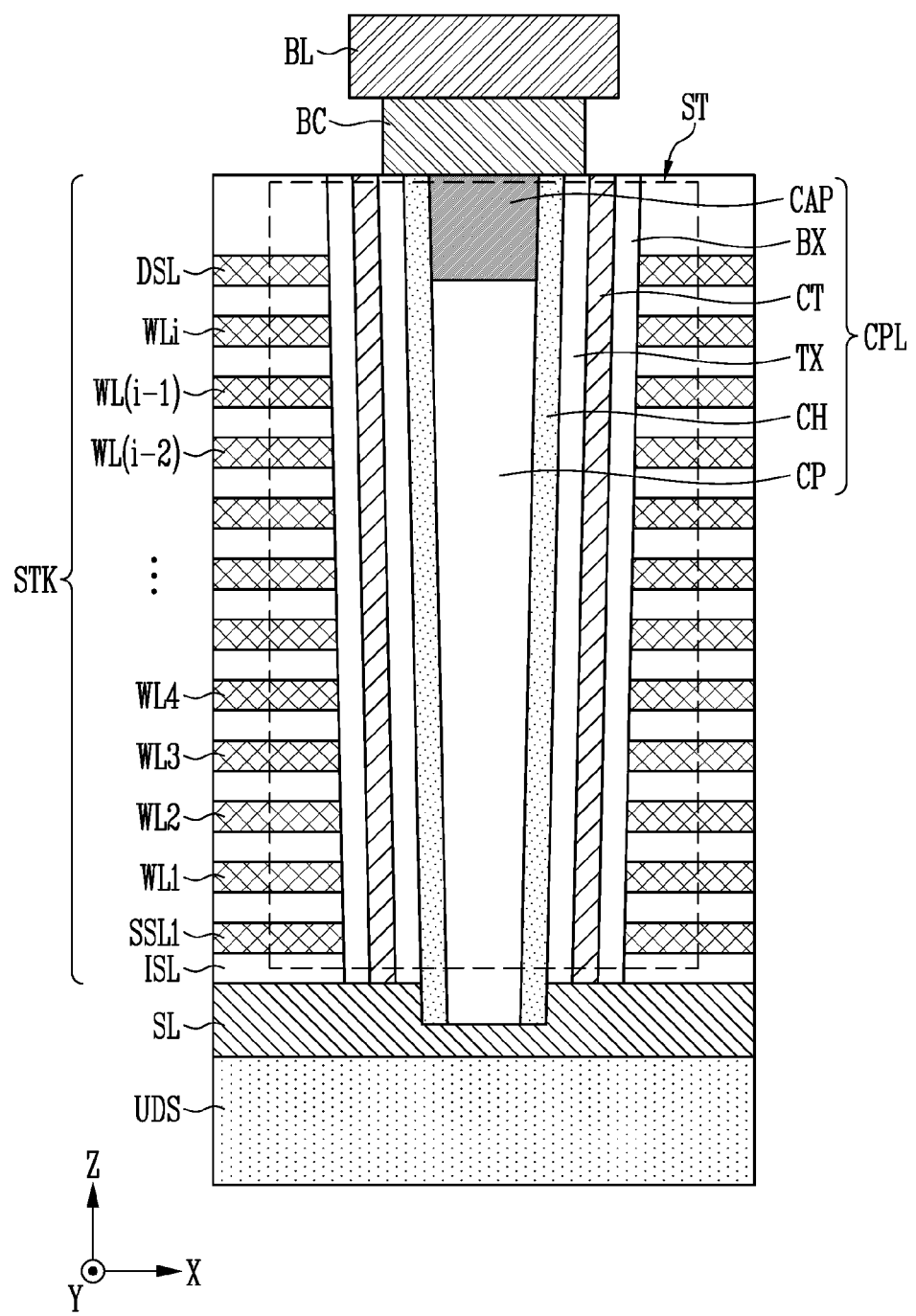
FIG. 5 is a diagram illustrating an example of a structure of a string.

FIG. 5 is a diagram illustrating a structure of a string.

Referring to FIG. 5, a source line SL may be formed on a lower structure UDS, and a stack structure STK may be formed on the source line SL. The lower structure UDS may be a substrate or a peripheral circuit. The source line SL may be formed of a conductive material. For example, the source line SL may be formed of poly-silicon. The stack structure STK may include insulating layers ISL formed between gate lines. The gate lines may include a source select line SSL, first to ith word lines WL1 to WLi, and a drain select line DSL. The gate lines may be formed of a conductive material. For example, the gate lines may be formed of a conductive material such as tungsten (W), molybdenum (Mo), cobalt (Co) or nickel (Ni), or a semiconductor material such as silicon (Si) or poly-silicon (Poly-Si). In addition, the gate lines may be formed of various metal materials. The insulating layers ISL may be formed of an oxide layer or a silicon oxide layer. For example, a line adjacent to the source line SL among the gate lines may become the source select line SSL, some of gate lines stacked above the source select line SSL may become the first to ith word lines WL1 to WLi, and a gate lines formed above the ith word line WLi may become the drain select lines DSL.

A string ST may be configured with a cell plug CPL penetrating the stack structure STK. The cell plug CPL may include a blocking layer BX, a charge trap layer CT, a tunnel insulating layer TX, a channel layer CH, a core pillar CP, and a capping layer CAP. The blocking layer BX may be formed in a cylindrical shape penetrating the stack structure STK, and be formed of an oxide layer or a silicon oxide layer. The charge trap layer CT may be formed in a cylindrical shape along an inner wall of the blocking layer BX, and be formed of a nitride layer. The tunnel insulating layer TX may be formed in a cylindrical shape along an inner wall of the charge trap layer CT, and be formed of an oxide layer or a silicon oxide layer. The channel layer CH may be formed in a cylindrical shape along an inner wall of the tunnel insulating layer TX, and be formed of poly-silicon. The core pillar CP may be formed in a cylindrical shape filling the inside of the channel layer CH, and be formed of an insulating material such as an oxide layer or a silicon oxide layer. The capping layer CAP may be formed in a cylindrical shape on the top of the core pillar CP, and be formed of a conductive material. When the capping layer CAP is formed on the top of the core pillar CP, a height of a top surface of the core pillar CP may be formed lower than a height of a top surface of the channel layer CH, and the capping layer CAP may be formed in an upper region of the core pillar CP surrounded by the channel layer CH.

A bit line contact BC and a bit line BL may be formed on the top of the cell plug CPL. For example, the bit line contact BC may be formed of a conductive material, and be in contact with the channel layer CH included in the cell plug CPL. The bit line BL may be formed on the top of the bit line contact BC, and be formed of a conductive material.

FIGS. 6A, 6B, 7A, and 7B are diagrams illustrating a phenomenon in which threshold voltages of memory cells are changed due to interference in a program operation.

Figure 6A:
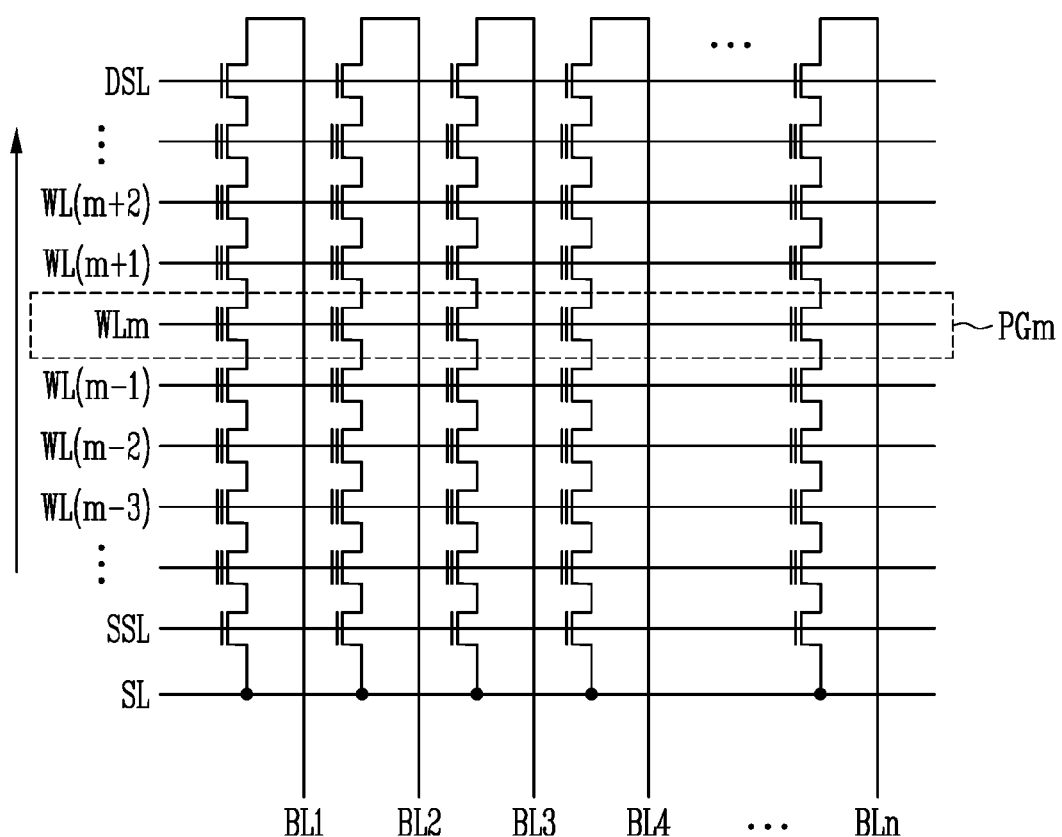
FIGS. 6A, 6B, 7A, and 7B are diagrams illustrating an example of a phenomenon in which threshold voltages of memory cells are changed due to interference in a program operation.
Figure 6B:
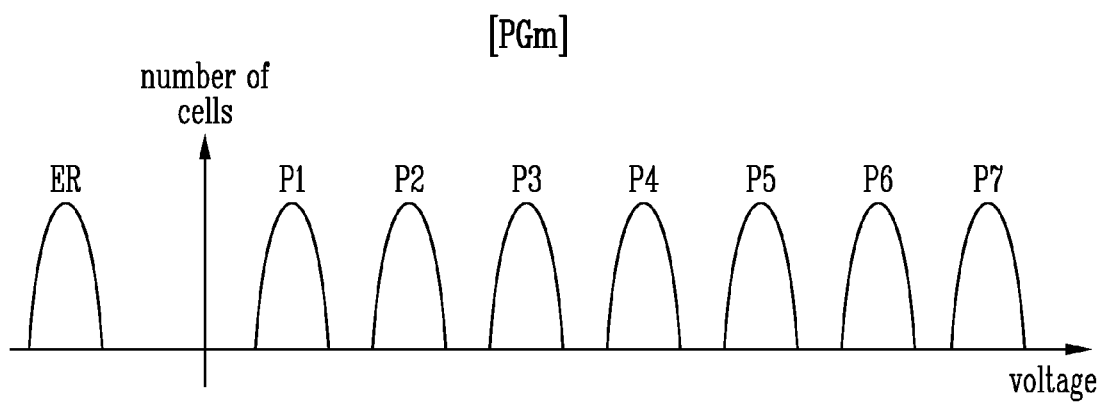
Figure 7A:
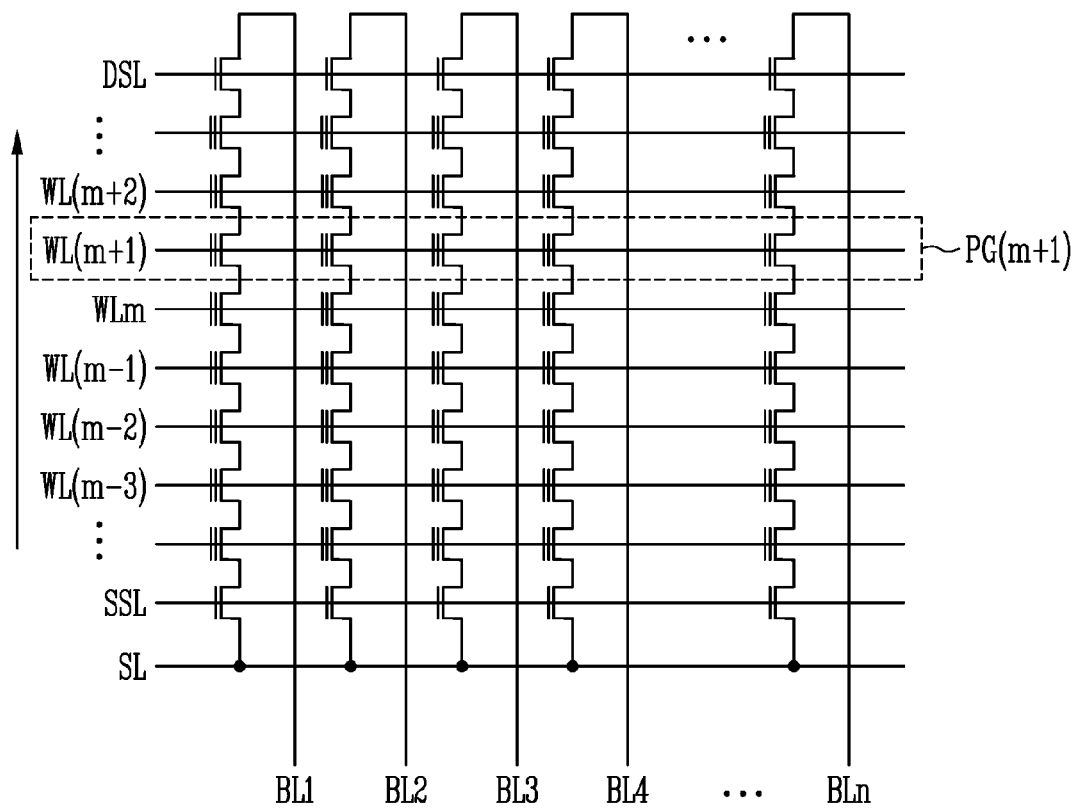
Figure 7B:
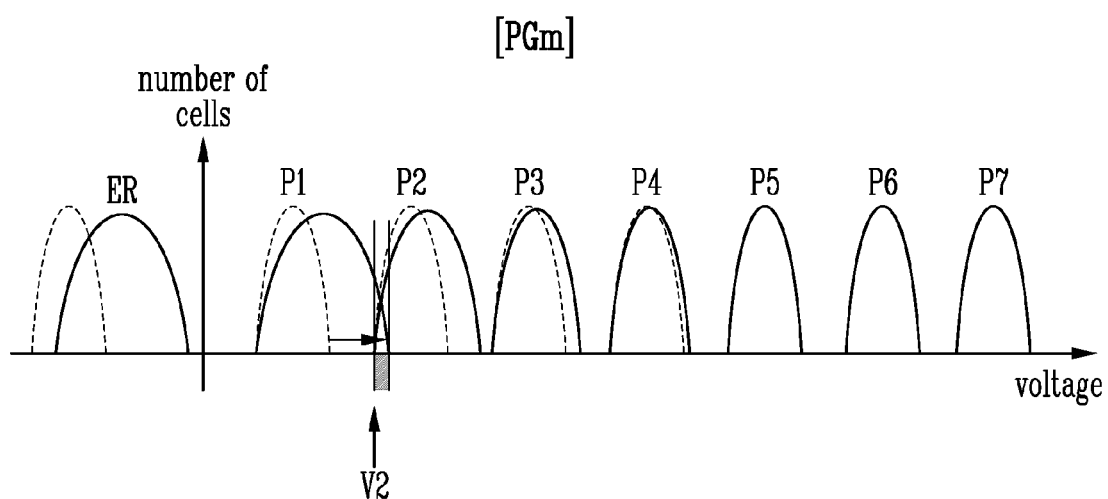

FIGS. 6A and 6B are diagrams illustrating a program operation of an mth page PGm, and FIGS. 7A and 7B are diagrams illustrating threshold voltages of memory cells included in the mth page PGm in a program operation of an (m+1)th page PG(m+1).

Referring to FIGS. 6A and 6B, it is assumed that a program operation is performed in a direction from a source select line SSL to a drain select line DSL. When an mth page PGm connected to an mth word line WLm is a selected page in the program operation, memory cells included in the mth page PGm may be programmed to different states according to target voltages. For example, when the program operation is performed in a triple level cell mode, the memory cells included in the mth page PGm may be programmed to an erase state ER or any one of first to seventh program states.

The program operation may be performed in an incremental step pulse program (ISPP) manner that stepwisely increases a program voltage applied to the mth word line WLm. A plurality of program loops may be performed in the program operation of the ISPP manner. In one program loop, a phase of increasing threshold voltages of memory cells by using a program voltage and a phase of verifying the threshold voltages of the memory cells by using a verify voltage may be performed. In the phase of verifying the threshold voltages of the memory cells, when it is determined that threshold voltages of selected memory cells are not increased to a target voltage, a program voltage higher than the program voltage used in the previous program loop may be used to increase the threshold voltages of the memory cells in a next program loop. For example, as a number of times a program loop is performed increases, a program voltage may be stepwisely increased by a predetermined step voltage. The word "predetermined" as used herein with respect to a parameter, such as a predetermined step voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Memory cells of which target voltage is set as a first target voltage may be programmed to the first program state P1, and memory cells of which target voltage is set a second target voltage higher than the first target voltage may be programmed to the second program state P2 higher than the first program state P1. In this manner, the memory cells included in the mth page PGm may be programmed to the first to seventh program states P1 to P7 according to first to seventh target voltages.

Referring to FIGS. 7A and 7B, when the program operation of the mth page PGm is completed, the selected page is changed to an (m+1)th page PG(m+1). When the selected page is changed to the (m+1)th page PG(m+1), a program operation of applying a stepwisely increased program voltage to the (m+1)th page PG(m+1) may be performed.

Since the program voltage is a positive voltage for moving electrons to a channel layer of memory cells included in the selected page, the program voltage may have influence on not only the memory cells included in the selected page but also unselected memory cells included in an unselected page. For example, while the program operation of the memory cells included in the (m+1)th page PG(m+1) is performed, some memory cells of the mth page PGm which has been completely programmed may be influenced by the program voltage applied to the (m+1)th page PG(m+1). Memory cells having relatively low threshold voltages among the memory cells included in the mth page PGm may be further influenced by a program operation of an adjacent page. For example, memory cells programmed to the first program state P7 among the memory cells programmed to the first to seventh program states P1 to P7 in the mth page PGm may be influenced most by the program operation of the (m+1)th page PG(m+1), and memory cells programmed to the seventh program state P1 among the memory cells programmed to the first to seventh program states P1 to P7 in the mth page PGm may be influenced least by the program operation of the (m+1)th page PG(m+1).

In the mth page PGm, a threshold voltage change level of the memory cells programmed to the first program state P1 is highest, and hence threshold voltages of some memory cells programmed to the first program state P1 may become higher than a second target voltage V2 of the second program state P2. In an embodiment, when threshold voltage distributions of memory cells programmed to different program states partially overlap with each other, the number of error bits detected in a read operation increases, and therefore, the reliability of the memory device may deteriorate.

Accordingly, in an embodiment described below, a program operation may be performed by decreasing a target voltage of some memory cells, in consideration of a program operation of an adjacent page. Subsequently, when the program operation of the adjacent page is ended, an additional program operation for increasing, to the target voltage, threshold voltages of the memory cells programmed to the decreased target voltage may be performed.

Figure 9:
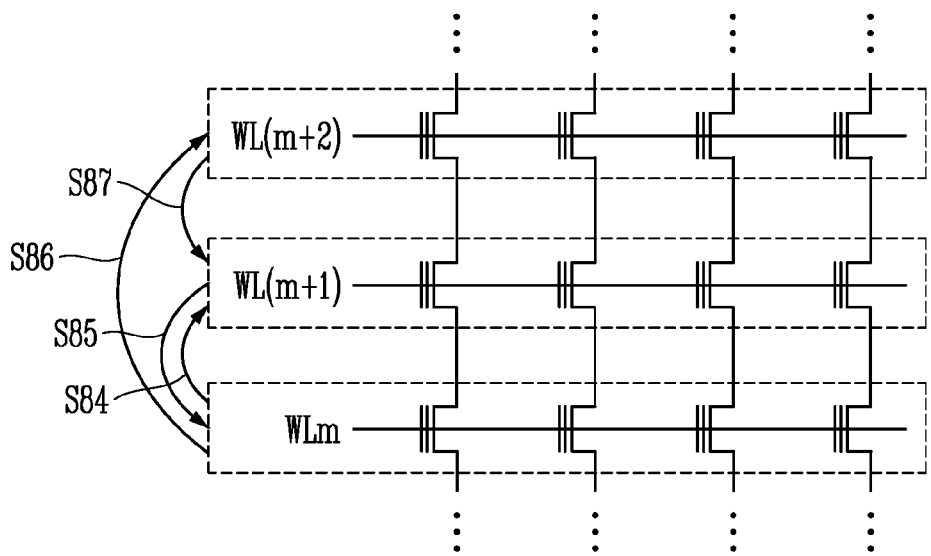
FIG. 9 is a diagram illustrating an example of a selection order of pages in the program operation in accordance with an embodiment of the present disclosure.

FIG. 8 is a diagram illustrating a program operation in accordance with an embodiment of the present disclosure. FIG. 9 is a diagram illustrating a selection order of pages in the program operation in accordance with an embodiment of the present disclosure.

Referring to FIGS. 8 and 9, when a program operation of a selected memory block is started, step S81 of setting target voltages corresponding to program states of memory cells may be performed. For example, when the program operation is performed in a triple level cell mode in which three-bit data is stored in one memory cell, first to seventh target voltages corresponding to first to seventh program states may be set. For example, when the program operation is performed in a quad level cell mode in which four-bit data is stored in one memory cell, first to fifteenth target voltages corresponding to first to fifteenth program states may be set. The mode of the program operation may vary according to a memory device, and therefore, the target voltages may be set according to the mode of the program operation performed in the memory device.

Step S82 of changing at least one target voltage lower than a reference voltage among the target voltages to a sub-target voltage having a level lower than a default level may be performed. The default level may be a basic level set at the beginning in the memory device. The reference voltage may be set as any one voltage among the target voltages. For example, the reference voltage may be set any one of the other target voltages except a lowest voltage among the target voltages. For example, when the second target voltage among the first to seventh target voltages is set as the reference voltage, a target voltage lower than the reference voltage becomes the first target voltage. Therefore, the first target voltage may be changed to a first sub-target voltage. The first sub-target voltage may be set as a positive voltage higher than a highest voltage among threshold voltages of memory cells in an erase state and lower than the first target voltage. For example, when the fourth target voltage among the first to seventh target voltages is set as the reference voltage, target voltages lower than the reference voltage become the first to third target voltages. The first to third target voltages may be changed to first to third sub-target voltages. The first sub-target voltage may be set as a positive voltage higher than a highest voltage among threshold voltages of memory cells in the erase state and lower than the first target voltage. The second sub-target voltage may be set higher than a highest voltage among threshold voltages of memory cells in the first program state and lower than the second target voltage. The third sub-target voltage may be set higher than a highest voltage among threshold voltages of memory cells in the second program state and lower than the third target voltage.

When the sub-target voltage is set, a program operation of an mth page may be performed. The program operation of the mth page may be performed by the other target voltages which are not changed to the sub-target voltage and the sub-target voltage. For example, when the first target voltage is changed to the first sub-target voltage and the second to seventh target voltages are maintained at the default level in the step S82, the memory cells may be programmed according to the first sub-target voltage and the second to seventh target voltages in the program operation of the mth page. When memory cells to be programmed to the first target voltage are programmed to the second sub-target voltage lower than the first target voltage and memory cells to be programmed to the second to seventh target voltages are programmed to the second to seventh target voltages, a program operation of a next page may be performed.

When the memory cells are programmed according to the sub-target voltage and the target voltages in the program operation of the mth page (S83), a program operation of an (m+1)th page as the next page may be performed (S84). Like the program operation of the mth page, the program operation of the (m+1)th page may also be performed by using the sub-target voltage and the other target voltages. While the program operation of the (m+1)th page is performed, threshold voltages of some memory cells included in the mth page may be increased by a program voltage applied to an (m+1)th word line connected to the (m+1)th page. However, since memory cells influenced much by a program operation of an adjacent page among the memory cells included in the mth page have been programmed to the sub-target voltage lower than the target voltage, threshold voltages of the corresponding memory cells are not increased to the target voltage even when the threshold voltages of the memory cells are increased.

When memory cells are programmed according to the sub-target voltage and the target voltages in the program operation of the (m+1)th page (S84), an additional program operation of the mth page as a previous page may be performed (S85). The additional program operation may be selectively performed on programmed memory cells according to the sub-target voltage in a selected page. For example, memory cells programmed according to the sub-target voltage in the mth page may be selected, and the additional program operation may be performed on only the selected memory cells. The additional program operation may be performed by using a target voltage higher than the sub-target voltage. That is, the additional program operation may be performed to increase, to the target voltage, threshold voltages of memory cells of the previous page, which are programmed to a level lower than a default level. The additional program operation may be performed by using a lowest voltage among program voltages as a start program voltage. The additional program operation may be performed in the ISPP manner. When the additional program operation of the mth page is ended, the program operation of the mth page is completed.

When the additional program operation of the mth page is ended, which is performed in the step S85, is ended, a program operation of an (m+2)th page may be performed (S86). Like the program operation of the (m+1)th page, the program operation of the (m+2)th page may be performed by using the sub-target voltage and the other target voltages. While the program operation of the (m+2)th page is performed, threshold voltages of some memory cells included in the (m+1)th page may be increased by a program voltage applied to an (m+2)th word line connected to the (m+2)th page. However, since memory cells influenced much by a program operation of an adjacent page among the memory cells included in the (m+1)th page have been programmed to the sub-target voltage lower than the target voltage, threshold voltages of the corresponding memory cells are not increased to the target voltage even when the threshold voltages of the memory cells are increased.

When the memory cells are programmed according to the sub-target voltage and the target voltages in the program operation of the (m+2)th page (S86), an additional program of the (m+1)th page may be performed (S87). The additional program of the (m+1)th page is performed in the same manner as the additional program operation performed in the step S85, and therefore, overlapping descriptions in relation to the additional program will be omitted.

Figure 10A:
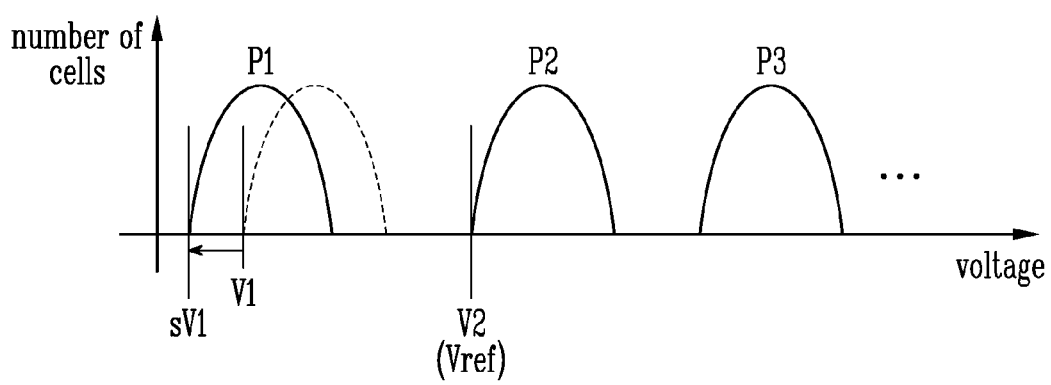
FIGS. 10A, 10B, and 10C are diagrams illustrating an example of a program operation in accordance with a first embodiment of the present disclosure.
Figure 10B:
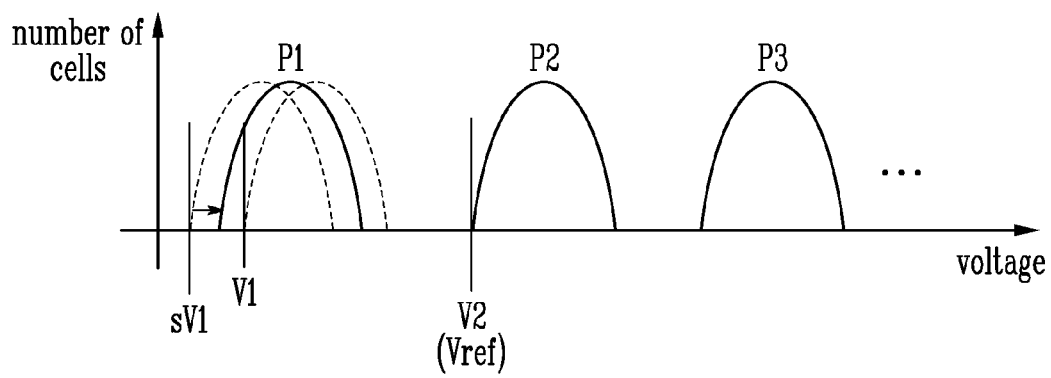
Figure 10C:
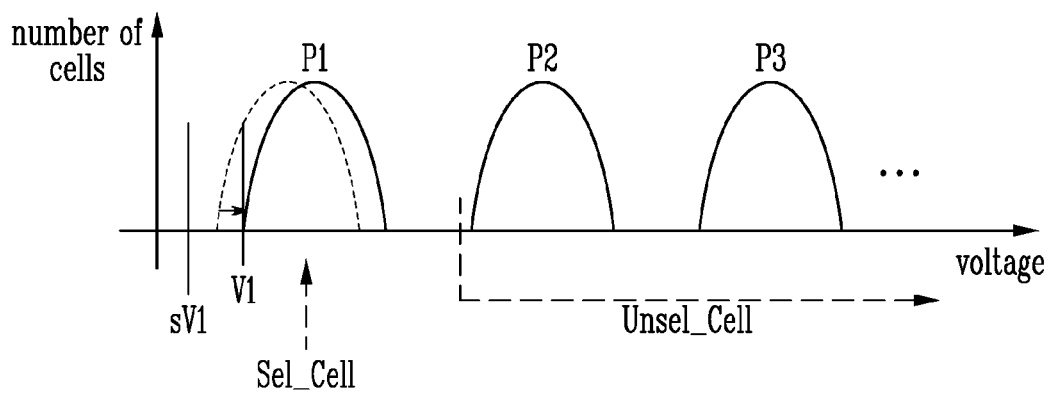

As described in the steps S81 to S87, program operations and additional program operations of the other pages included in the selected memory block may be performed. In a program operation of a last page among the pages included in the selected memory block, the sub-target voltage set in the step S82 is not used, and only the target voltages set in the step S81 may be used. When the program operation of the last page is completed, an additional program operation of a previous page of the last page may be performed. When the additional program operation of the previous page of the last page is ended, the program operation of the selected memory block may be ended. FIGS. 10A to 10C are diagrams illustrating a program operation in accordance with a first embodiment of the present disclosure.

FIG. 10A illustrates a threshold voltage distribution of the memory cells included in an mth page in the program operation of the mth page, FIG. 10B illustrates a threshold voltage distribution of the memory cells included in the mth page in the program operation of an (m+1)th page, and FIG. 10C illustrates a threshold voltage distribution of the memory cells included in the mth page in the additional program operation of the mth page.

Referring to FIGS. 10A to 10C, a program operation when a second target voltage V2 is set as a reference voltage Vref is described in the first embodiment.

Referring to FIG. 10A, when the reference voltage Vref is set as the second target voltage V2, a target voltage lower than the reference voltage Vref becomes a first target voltage V1. Therefore, in a program operation of an mth page PGm, the first target voltage V1 may be changed to a first sub-target voltage sV1 lower than the first target voltage V1. For example, the first sub-target voltage sV1 may be set as a positive voltage higher than a highest voltage among threshold voltages of memory cells in the erase state and lower than the first target voltage V1. A voltage difference between the first target voltage V1 and the first sub-target voltage sV1 may be set greater than a variation of a threshold voltage increased in a program operation of an adjacent page. The variation of the threshold voltage increased in the program operation of the adjacent page may be calculated through a test program operation of the memory device, and the first sub-target voltage sV1 may be determined according to a voltage difference greater than the calculated variation. The test program operation may be performed on some pages when the memory device is manufactured. For example, Dummy data is programmed on the selected page in the test program operation. After the test program operation is performed on the selected page, the variation of the threshold voltage of the programmed page among the pages adjacent to the selected page may be measured. After the test program operation, a selected memory block is erased. The other target voltages except the first target voltage V1 may have a default level basically set in the memory device.

When the first target voltage V1 is changed to the first sub-target voltage sV1, a verify voltage corresponding to the first target voltage V1 is decreased to a voltage corresponding to the first sub-target voltage sV1. Therefore, when the program operation of the mth page PGm is performed, memory cells corresponding to the first target voltage V1 may be programmed according to the first sub-target voltage sV1, and the other memory cells may be programmed according to the target voltages having the default level.

Referring to FIG. 10B, after the program operation of the mth page PGm is ended, a program operation of an (m+1)th page PGm+1 may be performed. The (m+1)th page PGm+1 may be a page selected according to an order of program operations among pages adjacent to the mth page PGm. The program operation performed on the (m+1)th page PGm+1 may be performed in the same manner as the program operation performed on the mth page PGm. While the program operation of the (m+1)th page PGm+1 is performed, threshold voltages of memory cells programmed according to the first sub-target voltage sV1 among memory cells included in the mth page PGm may be increased. For example, threshold voltages of some memory cells included in the mth page PGm may be increased by a program voltage applied to an (m+1)th word line connected to the (m+1)th page PGm+1. Since the voltage difference between the first target voltage V1 and the first sub-target voltage sV1 is greater than the variation of the threshold voltage, calculated through the test program operation of the adjacent page, the threshold voltages of the memory cells programmed according to the first sub-target voltage sV1 in the mth page PGm is not increased to the first target voltage V1 or higher.

Referring to FIG. 10C, when the program operation of the (m+1)th page PGm+1 is ended, a selected page may be again changed to the mth page PGm, and an additional program operation of the mth page PGm may be performed. In the additional program operation, the memory cells programmed according to the first sub-target voltage sV1 become selected memory cells Sel_Cell, and the other memory cells become unselected memory cells Unsel_Cell. The first target voltage V1 may be used as a target voltage in the additional program operation. In the additional program operation, a program allow voltage may be applied to bit lines of the selected memory cells Sel_Cell, and a program inhibit voltage may be applied to bit lines of the unselected memory cells Unsel_Cell. The program allow voltage may be 0V or a negative voltage, and the program inhibit voltage may be a positive voltage or a power voltage.

The additional program operation may be performed in the ISPP manner. In the program operation of the ISPP manner, program voltages may be applied to an mth word line connected to the mth page PGm from a lowest voltage among the program voltages. For example, when the additional program operation is started, a start program voltage may be applied to the mth word line, and the program voltage may be stepwisely increased as a number of times a program loop is performed increases. In the program operation of the ISPP manner, a verify operation may be performed on the first target voltage V1.

When the additional program operation of the mth page PGm is ended, the program operation of the mth page PGm may be completed.

Figure 11A:
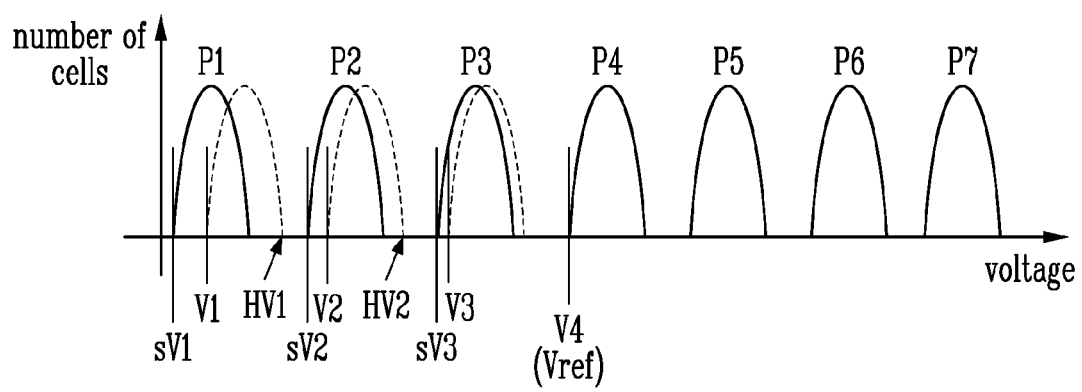
FIGS. 11A, 11B, and 11C are diagrams illustrating an example of a program operation in accordance with a second embodiment of the present disclosure.
Figure 11B:
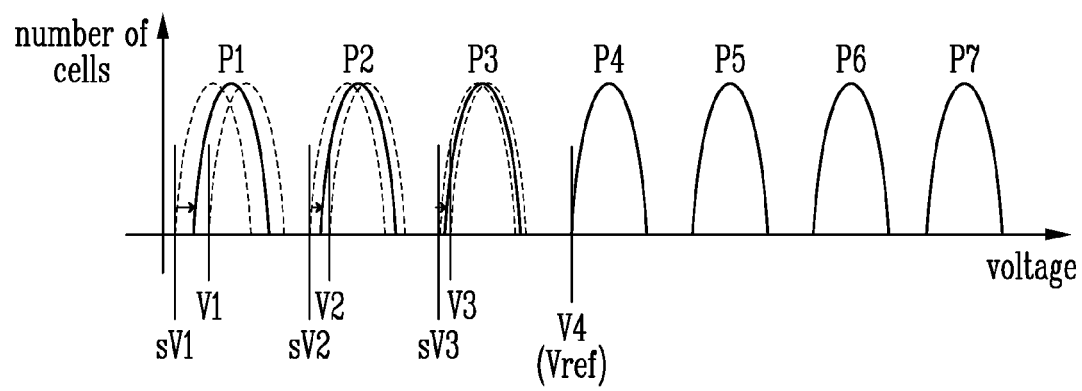
Figure 11C:
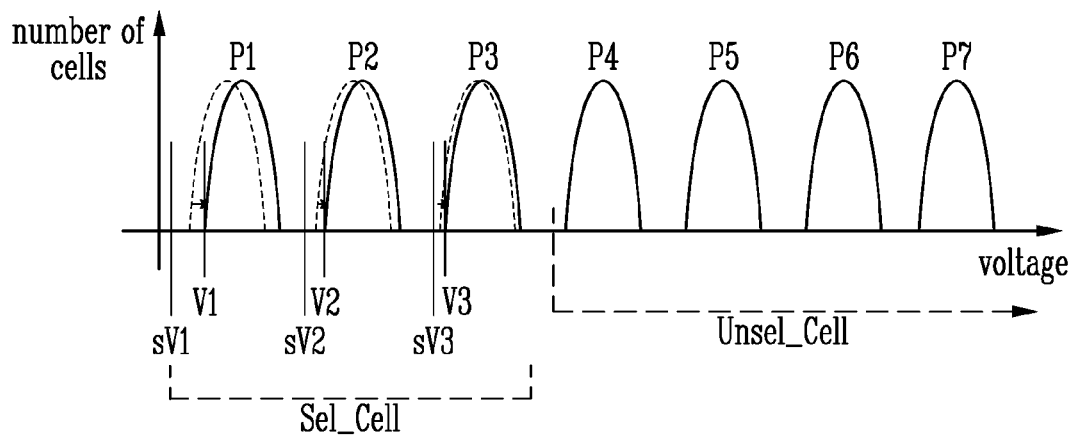

FIGS. 11A to 11C are diagrams illustrating a program operation in accordance with a second embodiment of the present disclosure.

FIG. 11A illustrates a threshold voltage distribution of the memory cells included in an mth page in the program operation of the mth page, FIG. 11B illustrates a threshold voltage distribution of the memory cells included in the mth page in the program operation of an (m+1)th page, and FIG. 11C illustrates a threshold voltage distribution of the memory cells included in the mth page in the additional program operation of the mth page.

Referring to FIGS. 11A to 11C, a program operation when a plurality of target voltages are lower than a reference voltage Vref is described in the second embodiment. The reference voltage Vref may be set as any one voltage among third to seventh target voltages V3 to V7. The second embodiment described below illustrates a program operation in which the fourth target voltage V4 is set as the reference voltage.

Referring to FIG. 11A, when the reference voltage Vref is set as the fourth target voltage V4, target voltages lower than the reference voltage Vref become the first to third target voltages V1 to V3. Therefore, in a program operation of an mth page PGm, the first target voltage V1 may be changed to a first sub-target voltage sV1 lower than the first target voltage V1, the second target voltage V2 may be changed to a second sub-target voltage sV2 lower than the second target voltage V2, and the third target voltage V3 may be changed to a third sub-target voltage sV3 lower than the third target voltage V3. For example, the first sub-target voltage sV1 may be set as a positive voltage higher than a highest voltage among threshold voltages of memory cells in the erase state and than the first target voltage v1. The second sub-target voltage sV2 may be set as a voltage higher than a highest voltage HV1 among threshold voltages of the first program state P1. The third sub-target voltage sV3 may be set as a voltage higher than a highest voltage HV2 among threshold voltages of the second program state P2.

A voltage difference between the first target voltage V1 and the first sub-target voltage sV1, a voltage difference between the second target voltage V2 and the second sub-target voltage sV2, and a voltage difference between the third target voltage V3 and the third sub-target voltage sV3 may be set greater than a variation of a threshold voltage corresponding to each of the program states in a program operation of an adjacent page. The variation of the threshold voltage increased in the program operation of the adjacent page may be calculated through a test program operation of the memory device, and the first to third sub-target voltages sV1 to sV3 may be determined according to a voltage difference greater than the calculated variation. The other target voltages except the first to third sub-target voltages sV1 to sV3 may have a default level basically set in the memory device.

When the first target voltage V1 is changed to the first sub-target voltage sV1, a verify voltage corresponding to the first target voltage V1 is decreased to a voltage corresponding to the first sub-target voltage sV1. When the second target voltage V2 is changed to the second sub-target voltage sV2, a verify voltage corresponding to the second target voltage V2 is decreased to a voltage corresponding to the second sub-target voltage sV2. When the third target voltage V3 is changed to the third sub-target voltage sV3, a verify voltage corresponding to the third target voltage V3 is decreased to a voltage corresponding to the third sub-target voltage sV3. Therefore, when the program operation of the mth page is performed, memory cells corresponding to the first target voltage V1 may be programmed according to the first sub-target voltage sV1, memory cells corresponding to the second target voltage V2 may be programmed according to the second sub-target voltage sV2, and memory cells corresponding to the third target voltage V3 may be programmed according to the third sub-target voltage sV3. The other memory cells may be programmed according to the target voltages having the default level.

Referring to FIG. 11B, after the program operation of the mth page PGm is ended, a program operation of an (m+1)th page PGm+1 may be performed. The (m+1)th page PGm+1 may be a page selected according to an order of programs among pages adjacent to the mth page PGm. The program operation performed on the (m+1)th page PGm+1 may be performed in the same manner as the program operation performed on the mth page PGm. While the program of the (m+1)th page PGm+1 is performed, threshold voltages of memory cells programmed according to the first to third sub-target voltages sV1 to sV3 among memory cells included in the mth page PGm may be increased. A variation of the increased threshold voltages becomes larger as the threshold voltages become lower. For example, a variation of threshold voltages of memory cells programmed according to the first sub-target voltage sV1 may be largest, and a variation of threshold voltages of memory cells programmed according to the third sub-target voltage sV3 may be smallest.

Referring to FIG. 11C, when the program operation of the (m+1)th page PGm+1 is ended, a selected page may be again changed to the mth page PGm, and an additional program operation of the mth page PGm may be performed. In the additional program operation, the memory cells programmed according to the first to third sub-target voltages sV1 to sV3 become selected memory cells Sel_Cell, and the other memory cells become unselected memory cells Unsel_Cell. The first to third target voltages V1 to V3 may be used as target voltages in the additional program operation. In the additional program operation, a program allow voltage may be applied to bit lines of the selected memory cells Sel_Cell, and a program inhibit voltage may be applied to bit lines of the unselected memory cells Unsel_Cell. The program allow voltage may be 0V or a negative voltage, and the program inhibit voltage may be a positive voltage or a power voltage.

The additional program operation may be performed in the ISPP manner. In the program operation of the ISPP manner, program voltages may be applied to an mth word line connected to the mth page PGm from a lowest voltage among the program voltages. For example, when the additional program operation is started, a start program voltage may be applied to the mth word line, and the program voltage may be stepwisely increased as a number of times a program loop is performed increases. In the program operation of the ISPP manner, a verify operation may be performed on the first to third target voltages V1 to V3.

When the additional program operation of the mth page PGm is ended, the program operation of the mth page PGm may be completed.

Figure 12:
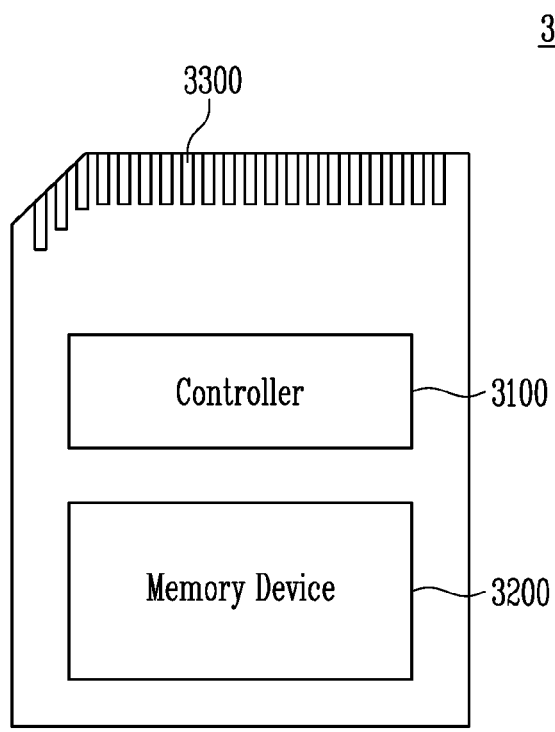
FIG. 12 is a diagram illustrating an example of a memory card system to which the memory device is applied in accordance with an embodiment of the present disclosure.

FIG. 12 is a diagram illustrating a memory card system to which the memory device is applied in accordance with an embodiment of the present disclosure.

Referring to FIG. 12, the memory card system 3000 includes a controller 3100, a memory device 3200, and a connector 3300.

The controller 3100 may be connected to the memory device 3200. The controller 3100 may access the memory device 3200. For example, the controller 3100 may control a program, read or erase operation, or control a background operation of the memory device 3200. The controller 3100 may provide an interface between the memory device 3200 and a host. The controller 3100 may drive firmware for controlling the memory device 3200. For example, the controller 3100 may include components such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. For example, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The memory device 3200 may include memory cells, and be configured identically to the memory device 100 shown in FIG. 2.

The controller 3100 and the memory device 3200 may be integrated into a single semiconductor device, to constitute a memory card. For example, the controller 3100 and the memory device 3200 may constitute a memory card such as a personal computer (PC) card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
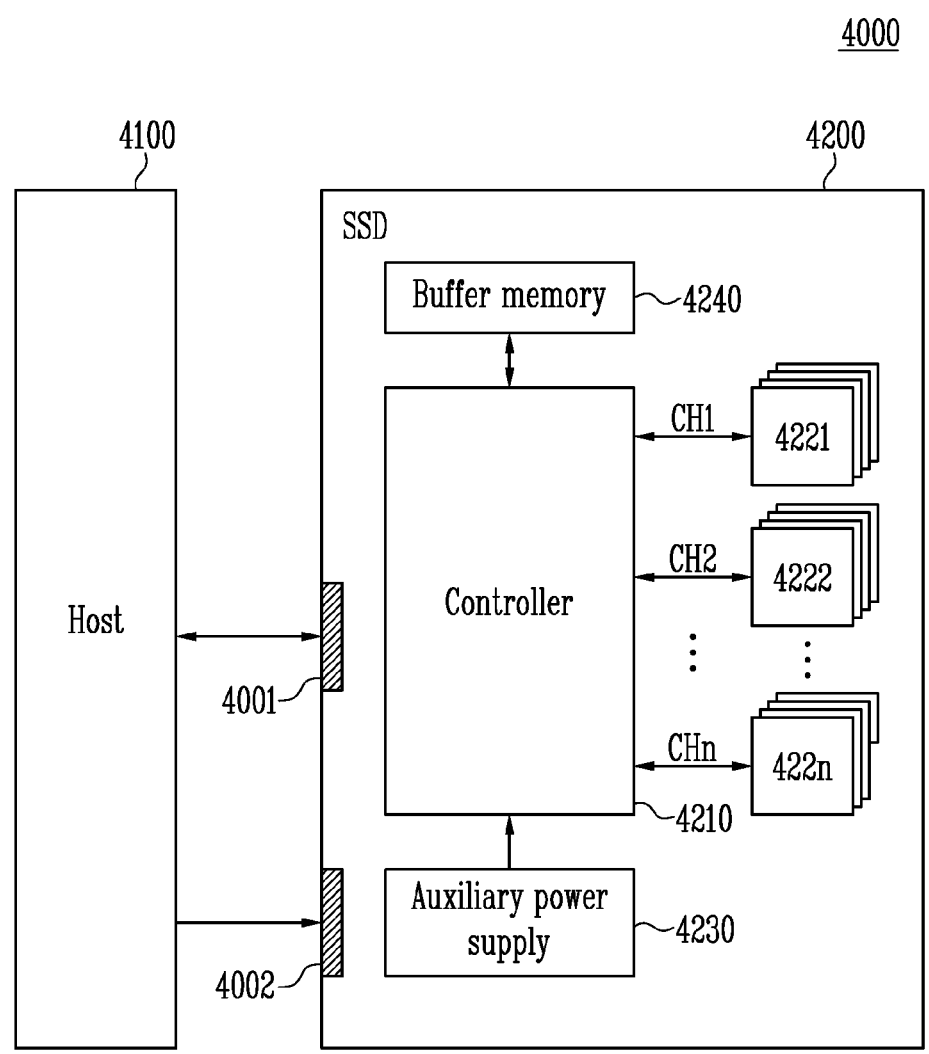
FIG. 13 is a diagram illustrating an example of a Solid State Drive (SSD) system to which the memory device is applied in accordance with an embodiment of the present disclosure.

FIG. 13 is a diagram illustrating a Solid State Drive (SSD) system to which the memory device is applied in accordance with an embodiment of the present disclosure.

Referring to FIG. 13, the SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include cells capable of storing data. Each of the plurality of memory devices 4221 to 422n may be configured identically to the memory device 100 shown in FIG. 2.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. For example, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of memory devices 4221 to 422n, or temporarily store meta data (e.g., a mapping table) of the memory devices 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, in an embodiment, the reliability of the memory device can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a memory block including a plurality of pages, each page from the plurality of pages including memory cells, the memory cells configured to be programmed to different program states according to a plurality of target voltages; and
a peripheral circuit configured to perform a program operation of a selected page among the plurality of pages,
wherein the peripheral circuit is configured to:
decrease at least one target voltage among the plurality of target voltages to a corresponding sub-target voltage in the program operation of the selected page;
perform the program operation of the selected page according to the other target voltages except the at least one target voltage corresponding to the corresponding sub-target voltage among the target voltages and the corresponding sub-target voltage;
perform a program operation of a page adjacent to the selected page when the program operation of the selected page is ended; and
perform an additional program operation of memory cells programmed according to the corresponding sub-target voltage in the selected page according to the at least one target voltage corresponding to the corresponding sub-target voltage when the program operation of the adjacent page is ended.

2. The memory device of claim 1, wherein the peripheral circuit is configured to perform the program operations in a manner that stores at least two-bit data in memory cells included in the selected page.

3. The memory device of claim 1, wherein the plurality of target voltages are voltages for dividing the memory cells included in the selected page into memory cells having the different program states.

4. The memory device of claim 1, wherein the peripheral circuit is configured to:
set, as a reference voltage, a selected voltage among the other voltages except a lowest voltage among the plurality of target voltages; and
decrease the at least one target voltage which is lower than the reference voltage to the corresponding sub-target voltage.

5. The memory device of claim 1, wherein a voltage difference between the corresponding sub-target voltage and the at least one target voltage is set equal to or greater than a variation of threshold voltages of memory cells included in the selected page which are changed in the program operation of the page adjacent to the selected page.

6. The memory device of claim 5, wherein the variation of the threshold voltages of the memory cells is calculated by a test program operation of the plurality of pages.

7. The memory device of claim 1, wherein the peripheral circuit is configured to perform the program operation of the page adjacent to the selected page in the same manner as the program operation of the selected page.

8. The memory device of claim 1, wherein the peripheral circuit is configured to perform the program operations in an incremental step pulse program (ISPP) manner.

9. The memory device of claim 1, wherein the peripheral circuit includes:
a control circuit configured to output an operating signal, a page buffer control signal, and a row address in response to a program command and an address;
a voltage generating circuit configured to generate a program voltage or a verify voltage in response to the operating signal;
a page buffer group configured to supply a program inhibit voltage or a program allow voltage to bit lines connected to the memory block in response to the page buffer control signal; and
a row decoder configured to transfer the program voltage or the verify voltage to word lines connected to the memory block in response to the row address.

10. The memory device of claim 9, wherein the control circuit is configured to determine levels of the plurality of target voltages and the corresponding sub-target voltage, which are to be applied to the plurality of pages, and generate and output the operating signal such that the verify voltage is generated according to the plurality of target voltages and the corresponding sub-target voltage.

11. A method of operating a memory device, the method comprising:
setting target voltages corresponding to program states of memory cells;
decreasing, to a sub-target voltage, a target voltage lower than a reference voltage among the target voltages;
performing a program operation of a selected page according to the other target voltages except the target voltage corresponding to the sub-target voltage among the target voltages and the sub-target voltage;
performing a program operation of a page adjacent to the selected page, when the program operation of the selected page is ended; and
performing an additional program operation of memory cells programmed according to the sub-target voltage in the selected page, when the program operation of the adjacent page is ended.

12. The method of claim 11, wherein the target voltages are lowest voltages in threshold voltages corresponding to the respective program states.

13. The method of claim 11, wherein the reference voltage is selected among the other voltages except a lowest voltage among the target voltages.

14. The method of claim 11, wherein a voltage difference between the target voltage lower than the reference voltage and the sub-target voltage is set equal to or greater than a variation of threshold voltages of memory cells included in the selected page, which are changed in the program operation of the adjacent page.

15. The method of claim 14, wherein the variation of the threshold voltages of the memory cells is calculated by a test program operation of the pages.

16. The method of claim 11, wherein the program operations and the additional program operation are performed in an incremental step pulse program (ISPP) manner.

17. The method of claim 11, wherein, in the additional program operation, memory cells programmed according to the sub-target voltage in the selected page become selected memory cells, and the other memory cells become unselected memory cells.

18. The method of claim 17, wherein, in the additional program operation, a program allow voltage is applied to bit lines connected to the selected memory cells, and a program inhibit voltage is applied to bit lines connected to the unselected memory cells.

19. The method of claim 18, wherein the program allow voltage is set as a ground voltage, and the program inhibit voltage is set as a power voltage.

20. The method of claim 11, wherein the target voltages have a default level predetermined in the memory device.

21. A method of operating a memory device, the method comprising:
setting first to Kth target voltages, wherein 'K' is an integer greater than 1;
decreasing the first target voltage to a first sub-target voltage;
performing a program operation of memory cells to be programmed according to the first target voltage among memory cells included in an mth page among pages included in a memory block according to the first sub-target voltage, and the other memory cells in the mth page according to the second to Kth target voltages, wherein 'm' is an integer greater than zero;
performing a program operation of memory cells included in an (m+1)th page adjacent to the mth page among the pages included in the memory block in the same manner as the program operation performed on the mth page when the program operation of the mth page is ended; and
performing an additional program operation of the memory cells programmed according to the first sub-target voltage among the memory cells included in the mth page according to the first target voltage, when the program operation of the (m+1)th page is ended.

22. The method of claim 21, wherein the first sub-target voltage is set higher than a highest voltage among threshold voltages of memory cells in an erase state and lower than the first target voltage.

23. The method of claim 21, wherein a voltage difference between the first sub-target voltage and the first target voltage is set greater than a variation of threshold voltages of memory cells, which are in the (m)th page and changed in the program operation of the (m+1)th page.

* * * * *